United States Patent [19]

Karasawa

[11] Patent Number: 4,965,515
[45] Date of Patent: Oct. 23, 1990

[54] APPARATUS AND METHOD OF TESTING A SEMICONDUCTOR WAFER

[75] Inventor: Wataru Karasawa, Yokohama, Japan

[73] Assignee: Tokyo Electron Limited, Tokyo, Japan

[21] Appl. No.: 343,370

[22] Filed: Apr. 26, 1989

[30] Foreign Application Priority Data

Oct. 15, 1986 [JP] Japan .................................. 61-244948

[51] Int. Cl.$^5$ ............................................ G01R 31/28
[52] U.S. Cl. .................... 324/158 R; 324/73.1; 324/158 F; 358/106
[58] Field of Search ............ 324/73 R, 73 PC, 158 R, 324/158 F, 73.1; 358/106

[56] References Cited

U.S. PATENT DOCUMENTS

| | | | |
|---|---|---|---|
| 2,311,942 | 2/1943 | Hagemeyer | 432/259 |
| 3,991,302 | 11/1976 | Danner | 324/73 PC |
| 4,056,716 | 11/1977 | Baxter et al. | 324/73 PC |
| 4,097,226 | 6/1978 | Erikson | 219/405 |
| 4,101,759 | 7/1978 | Anthony | 219/411 |
| 4,454,585 | 6/1984 | Ele | 324/73 PC |
| 4,468,260 | 8/1984 | Hiramoto | 219/405 |
| 4,507,605 | 3/1985 | Geisel | 324/73 PC |
| 4,535,228 | 8/1985 | Mimura | 219/411 |
| 4,545,327 | 10/1985 | Campbell | 219/411 |
| 4,550,245 | 10/1985 | Arai | 219/411 |
| 4,649,261 | 3/1987 | Sheets | 219/411 |
| 4,755,654 | 7/1988 | Crowley | 219/411 |
| 4,755,747 | 7/1988 | Sato | 324/158 F |
| 4,758,782 | 7/1988 | Kobayashi | 324/73 PC |
| 4,786,867 | 11/1989 | Yamatsu | 324/158 F |

FOREIGN PATENT DOCUMENTS

| | | | |
|---|---|---|---|
| 0030964 | 2/1982 | Japan | 324/158 F |
| 58-28546 | 6/1983 | Japan . | |
| 58-95271 | 6/1983 | Japan . | |
| 0172562 | 10/1983 | Japan | 324/158 F |
| 59-35441 | 2/1984 | Japan . | |
| 59-184542 | 10/1984 | Japan . | |
| 60-24031 | 2/1985 | Japan . | |
| 63-99541 | 4/1988 | Japan . | |

Primary Examiner—Ernest F. Karlsen
Attorney, Agent, or Firm—Oblon, Spivak, McClelland, Maier & Neustadt

[57] ABSTRACT

An apparatus and method of testing semiconductor wafer, which are capable of properly processing inking errors caused in the process of determining whether the chips are good or bad. The apparatus comprises an inker for markings those chips which have been found defective by probing test, a TV camera for imaging the chips including those which have been found defective and marked, a computer system for comparing an image-signal with a reference-signal, and determining that the chip has no marking when the signals coincide and that the chip has a marking when the signals do not coincide, and a counter for counting those chips which have been determined to have markings or no marking by the computer system.

9 Claims, 2 Drawing Sheets

APPARATUS AND METHOD OF TESTING A SEMICONDUCTOR WAFER

BACKGROUND OF THE INVENTION

1. Field of the Invention

The present invention relates to an apparatus and method of testing a semiconductor wafer on which chips regularly arranged in a matrix pattern and, more particularly, an apparatus and method capable of properly processing inking errors caused in the process of determining whether the chips are good or bad.

2. Description of the Related Art

Semiconductor devices such as ICs and LSIs must be tested several times in the manufacturing course to evaluate their electrical characteristics. A wafer test process is performed between a wafer forming process and an assembly process. The wafer test process is intended to apply an electrical test to each of the devices (or semiconductor chips) in a matrix pattern after preprocesses such as pattern etching and protective film coating.

A wafer test system basically includes a wafer probing machine (also called a wafer prober) and a tester. These components are connected via a measuring line. A test-complete-signal and a test-fail-signal are exchanged between the wafer probing machine and the tester in response to a test-start-signal on a test control line.

This wafer probing machine comprises an X-Y table movable along the X- and Y-axes, a wafer setting stage equipped on the X-Y table, and a probe card having a plurality of probes which are brought into contact with pads of each chip on the semiconductor wafer placed on the wafer setting stage.

When a test of a given chip is finished in a probing test, the X-Y table is moved in the X- and Y-axes and a next chip is tested. A large number of chips formed on the semiconductor wafer in a matrix are tested in the unit of a row in this manner. Chips which are discriminated as defective are marked with an ink.

As disclosed in preliminarily-opened Japanese Patent Application Sho 59-35441, the conventional apparatus causes chips which are determined as defective to be marked with ink through the inker and distinguishes defective chips from good ones depending upon whether they are marked with ink or not. The tester or prober also serves to count good chips on the basis of their test results.

In the case of the conventional apparatus, however, ink is splashed to adhere to good chips around a defective one when the defective chip is to be marked with ink, thereby causing inking errors. Ink once adhered to the chip cannot be usually eliminated. When inking error is caused, therefore, it will create trouble in processes followed, because those chips which have been found good by the test is marked with ink.

In order to prevent this inking error, the operator is asked after the wafer test to count those chips which have no ink marking by a manual counter, observing all of chips on the semiconductor wafer through a magnifier. In other words, the operator tries to find marking errors of the inker by comparing the number of no marking chips counted by the operator's eyes with the number of chips which have been found good by the tester or prober.

In the case of the conventional apparatus, therefore, the counting of no marking chips depends largely upon whether or not the operator is skillful. In addition, the operator is likely to get fatigued and make counting errors because he must count the chips on the wafer through the magnifier.

When the number of chips counted has counting errors, it takes a substantial time to find the inker (or marker) malfunctioning, and processes followed will be carried out for this time period according to information including a wrong number of good chips. This lowers the reliability of chips thus produced.

It has been therefore asked that the process of accurately counting only those chips which have no ink marking is made automatic.

SUMMARY OF THE INVENTION

The object of the present invention is to provide a semiconductor wafer probing machine and method of automatically counting those chips on a semiconductor wafer which have ink markings or no ink marking without depending upon the operator's skill after the wafer probing test is finished.

According to an aspect of the present invention, there can be provided an apparatus for testing an object on which semiconductor devices are regularly arranged in a matrix pattern comprising a marking means for marking those devices in the matrix pattern which are determined to be defective by a probing test; an imaging means for imaging the object including those devices which are determined to be defective and marked with ink, and generating an image-signal representing the image of the object; a comparing/determining means for comparing the image-signal with a reference-signal, and determining that the device has no marking when the signals coincide, and that the device has a marking when the signals do not coincide; and a counting means for counting those devices which have been determined to have markings or no marking by the comparing/determining means.

It is preferable that the counting means counts only those devices which have been determined to have no marking by the comparing/determining means.

It is preferable that the devices (or chips) which have been determined to have markings include those to which splashing ink adheres mistakenly while defective chips are being marked with ink.

It is preferable that the imaging means is a CCD camera or an ITV camera.

According to another aspect of the present invention there can be provided a method of testing an object on which semiconductor devices are regularly formed in a matrix pattern, comprising the steps of:

(1) marking those devices which have been found defective by a probing test;

(2) imaging the object including the devices which are determined to be defective and bear markings, and generating an image-signal representing the image of the object;

(3) comparing said image-signal with a reference-signal previously stored and converted from an image of the object whose devices in the matrix pattern are prior to the marking step;

(4) determining that the device has no marking when the signals coincide and that the device has a marking when the signals do not coincide; and (5) counting those devices which have been determined to have markings or no marking by the comparing and determining steps.

DETAILED DESCRIPTION OF THE PREFERRED EMBODIMENTS

Figure 1:
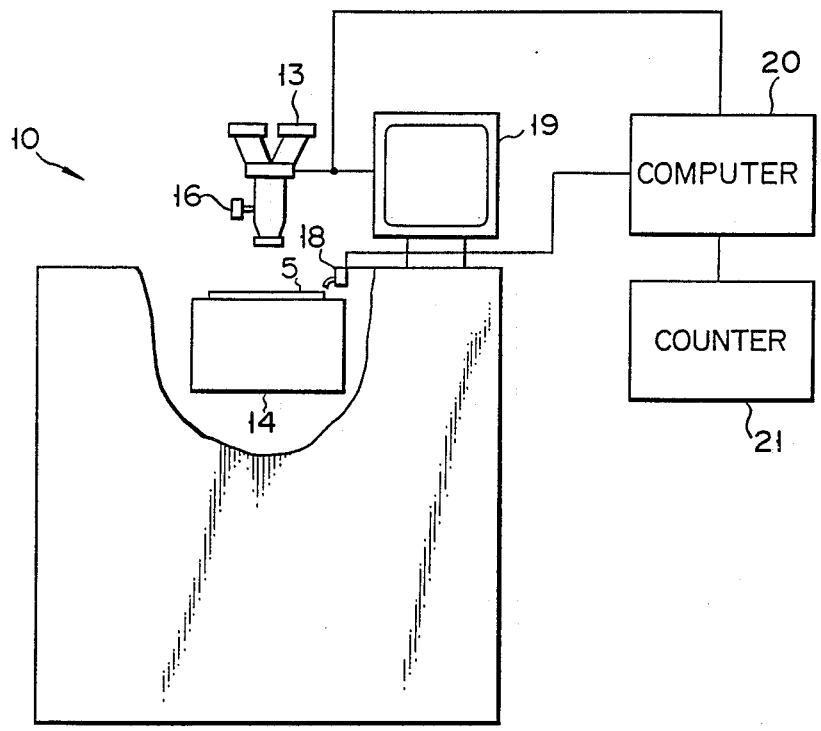
FIG. 1 is a front view roughly showing a semiconductor wafer probing machine.

Various embodiments of the present invention will now be described, with reference to the accompanying drawings. These embodiment each has a display which can display an image of semiconductor devices orderly arranged in a matrix pattern, such as semiconductor wafers, or ships obtained by scribing wafers and arranged on a tray.

Full automatic wafer probing machine (or Prober) 10 for testing semiconductor wafers 5 is installed on a floor through damping members. Wafer probing machine 10 includes a cassette table (not shown), a wafer conveyor (not shown), a loader/unloader (not shown), an automatic alignment system (not shown), a probe card (not shown), TV camera 13 provided with convergent lens 16, an X-Y-Z-$\theta$ drive system (not shown) for wafer setting stage 14, inker 18 for inking wafer 5 on wafer setting stage 14, CRT display 19 and the like.

The wafer cassette which stores a large number of semiconductor wafers can be loaded in or unloaded from the cassette table of machine 10. Semiconductor wafer 5 picked up from the cassette is placed on wafer setting stage 14 via the wafer conveyor, the loader/unloader, and the automatic alignment system. Wafer setting stage 14 is supported by the X-Y-Z-$\theta$ drive system provided with a pulse motor.

The probe card and TV camera 13 are located, switchable each other, above the test section of prober 10.

The probe card (not shown) opposes the pattern forming face of semiconductor wafer 5 on wafer setting stage 14 during a test. The probe card is inserted into a test head (not shown) and provided with a large number of probes. which are electrically connected to input-/output terminals of a tester (not shown) through wires in an insert ring (not shown) and measuring lines (not shown). Further, the tester is connected to computer 20 where test data on each of semiconductor chips on wafer 5 is stored in a memory.

TV camera 13 opposes the pattern forming face of semiconductor wafer 5 on wafer setting stage while the test is not being conducted. TV camera 13 may serve as a pickup camera to automatically image wafer 5 and as a magnifier through which the operator can observe wafer 5 directly by hand-operating camera 13 ITV or CCD camera can be used as TV camera 13.

As shown in FIG. 1, for example, images picked up by TV camera 13 are displayed on display 19. Light incident onto TV camera 13 is converted into electric signals, which are stored, as image output data, in the memory of computer 20.

Figure 2:
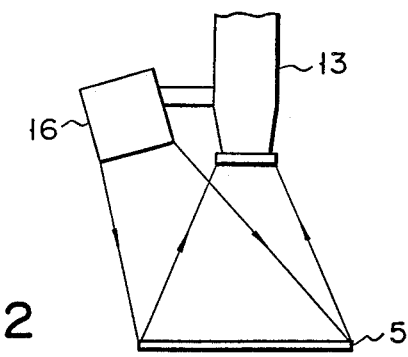
FIG. 2 is an enlarged view showing a TV camera section of the semiconductor wafer probing machine.

As shown in FIG. 2, TV camera 13 has a light source (not shown) and convergent lens 16. When light focused by convergent lens 16 is irradiated on the pattern forming face of wafer 5, it is reflected by wafer 5 and entered into TV camera 13. It is further converted into electric signals by a photocoupler (not shown), which are inputted in the memory of computer 20.

Reference data which are electric signals representing the image of chips on wafer 5 prior to the inking process are previously stored in the memory of computer 20. The reference and image output data are called from the memory by means of CPU of computer 20 and compared with each other every chip on semiconductor wafer 5. When both of the data relating to a chip on wafer 5 coincide with each other, it is found that this chip is to be counted, and the chip is counted by counter 21. When both of the data do not coincide with each other, however, the chip is not counted by counter 21.

Inker 18 has an inking needle and an ink supply source (not shown) provided with a flow control valve which is electrically connected to the output terminal of computer 20.

Figure 3:
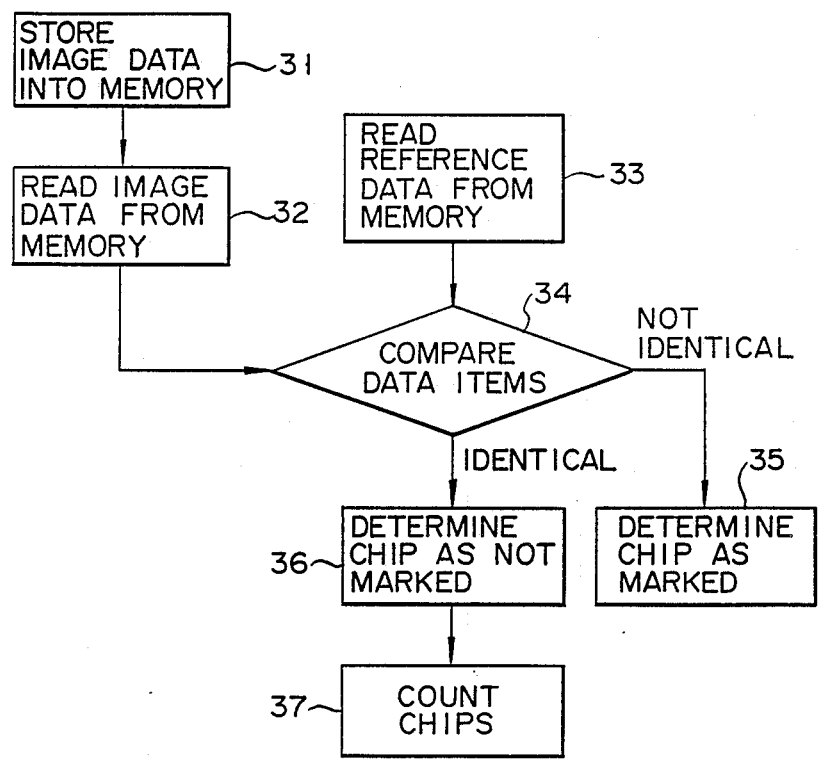
FIG. 3 is a flow chart intended to explain the process of counting chips on a semiconductor wafer after the wafer probing test.
Figure 4:
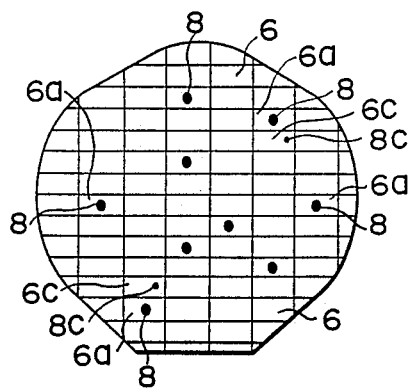
FIG. 4 roughly shows a semiconductor wafer to which marking ink adheres.

A case where the number of chips 6 which are not inked after the test of probing a sheet of wafer 5 are counted will be described referring to FIGS. 3 and 4.

(1) Wafer 5 is placed on wafer setting stage 14. The operator confirms positions of the pads (or electrodes) of each ship on wafer 5, by viewing the chip through, for example, a CCD camera. The operator input the data representing these positions to computer 20, thus "teaching" the computer the positions of the chips. This teaching process is performed for each group of chips arranged in a different pattern. Needless to say, the teaching process can be carried out when the counting of the chips is started, or whenever necessary. After this teaching process, TV camera 13 is replaced by the test head (not shown), and the probe card is set opposite to wafer 5. TV camera 13 need not be replaced by the test head if it is not located at the position where the test head must be set, and the light is supplied to the TV camera 13 through an optical fiber unit. Wafer setting stage 14 is lifted to bring the probes into contact with pads of the first chip. Test signal is sent from the tester to the first chip to test the first chip. After the test of the first chip is finished, the second chip will be tested. Chips 6 on wafer 5 are successively tested in this manner. All of these test data are inputted into computer 20. Information consisting of signal which denotes the address of a chip on coordinates of axes X and Y and signal which denotes the test result of the chip conducted by the tester to be good or defective is sent to computer 20 every chip on wafer 5 and written in a wafer map (a part of the program of the computer system).

(2) The tester displays defective chips 6a by defective signal and addresses of these defective chips 6a on coordinates of axes X and Y are mapped. Ink 8 is dropped on defective chips 6a on the basis of the information written in the wafer map. Ink 8 splashes around at this time and a part of ink 8 thus adheres to those chips which have been determined to be good. They are chips 6c to which ink 8 adheres.

(3) When test-final-signal is sent from the tester to computer 20, the test head is switched to TV camera 13 and light is irradiated all over wafer 5 through convergent lens 16. TV camera 13 picks up light reflected by wafer 5.

(4) Image picked up by TV camera 13 is converted into electric signal, which is outputted, as image-signal data, to computer 20.

(5) The image-signal data is temporarily stored in the memory of computer 20 (step 31).

(6) The reference data obtained from the image representing the chip of no marking (or chip to which no ink adheres) is called from the memory by means of CPU (step 33).

(7) The image-signal data are successively called from the memory (step 32), and the image-signal data and reference-signal data are compared with each other relating to each of the chips on wafer 5 (step 34). This comparison of the both data is successively carried out every one of chips 6 regularly formed on wafer 5 in this case.

(8) When both of the data do not coincide with each other, chip 6c relating to these data is not counted even if its test result is good (step 35).

(9) When both of the data coincide with each other, it is determined that chip 6 has no marking (or chip 6 is not inked) (step 36).

(10) Only chips 6 which are determined to have no marking are counted by counter 21 (step 37). The number of no-marking chips 6 counted is displayed on display 19.

According to the above-described embodiment of the present invention, the number of no-marking chips can be automatically counted. This enables the number of good chips obtained by the computer to coincide with that of no-marking chips on the wafer, thereby avoiding any trouble in the course of processes followed. The operator can grasp the number of no-marking chips without fail and without any skill.

The case where no-marking chips are counted has been cited to describe the embodiment of the present invention, but the present invention is not limited to this case. According to the present invention, chips 6c which have been determined to be good by their test results but to which splashing ink adheres can be selectively determined to distinguish from defective chips 6a.

Figure 5:
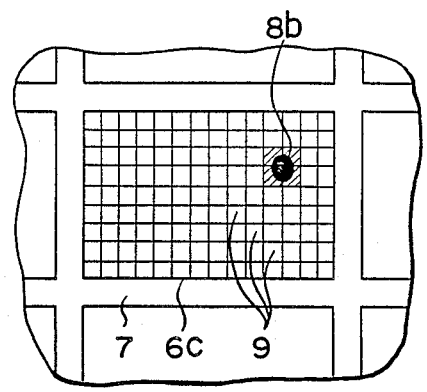
FIG. 5 is an enlarged view showing a chip which are adhered to splashing ink (errored ink).

As shown in FIG. 5, chip 6c is divided into fine picture elements 9 and splashed ink 8b is replaced by those picture elements 9 in which splashed ink 8b is present. Splashed ink 8b can be thus grasped as a pseudo-ink pattern. The ink pattern of defective chips is previously stored, as reference ink pattern, in the memory of computer 20 and the pseudo-ink pattern is compared with the reference ink pattern. To add more, chip 6c is partitioned by scribe lines 7 and ink adhering to scribe lines 7 is excluded from those to be determined.

According to the above-described variation of the present invention, chips 6c can be distinguished from defective chips 6a. This enables the number of inking errors to accurately be grasped, thereby contributing to the improvement of the inking process.

According to the present invention, marking chips (or chips to which ink adheres) can also be counted. In this case where only marking chips are counted, however, the number of those chips which are at the rim periphery of the wafer and incomplete as circuits and onto which ink never fails to be jetted becomes different when chip size and the like are changed. Therefore, this case cannot be expected to contribute to the improvement of the inking process.

As described above, the apparatus of the preset invention makes it possible for the number of those chips onto which no ink is jetted to automatically be counted without fail. Particularly, various kinds of troubles stemmed from operator's mistakes can be prevented, thereby enabling the reliability of the wafer test to be enhanced.

What is claimed is:

1. An apparatus for testing a semiconductor wafer on which devices are arranged at regular intervals in a matrix pattern, said apparatus comprising:
   probing test means for electrically testing the devices sequentially;
   marking means for marking those of the devices in the matrix pattern which are determined to be defective by the probing test means;
   image scanning means for optically scanning the semiconductor wafer including those devices which are determined to be defective and bear markings, and generating an image-signal representing the scanned image of the semiconductor wafer;
   comparing/determining means for comparing the image-signal with a reference-signal and determining that the device does not have a marking when the signals coincide with each other and that the device has a marking when the signals do not coincide with each other; and
   counting means for counting those of the devices which have been determined by the comparing/determining means to have markings or not to have markings.

2. The apparatus according to claim 1, wherein said counting means counts only those devices in the matrix pattern on the object which have been determined to have no marking by the comparing/determining means.

3. The apparatus according to claim 1, wherein the devices in the matrix pattern on the object determined to have markings by the comparing/determining means include those which are marked because of marking errors even if they have been found good by the probing test.

4. The apparatus according to claim 1, wherein said imaging means is a CCD camera or an ITV camera.

5. The apparatus according to claim 1, wherein the image of each of devices picked up by the imaging means is divided into fine picture elements and said comparing/determining means determines that the marking on a device is a pseudo-marking on the basis of those picture elements of the device on which the marking is present.

6. A method for testing a semiconductor wafer on which devices are formed at regular intervals in a matrix pattern, said method comprising the steps of:
   marking those of the devices which have been found defective by an electrical probing test;
   image-scanning the semiconductor wafer including those devices which are determined to be defective and bear markings, and generating an image-signal representing the scanned image of the semiconductor wafer;
   comparing said image-signal with a reference signal;
   determining that the device does not have a marking when the signals coincide with each other and that the device has a marking when the signals do not coincide with each other; and
   counting those devices which have been determined by the comparing and determining steps to have markings or not to have markings.

7. The method according to claim 6, whereby only those devices which have been determined to have no marking by the comparing and determining steps are counted in the course of the counting step.

8. The method according to claim 6, whereby the devices determined to have markings according to the comparing and determining steps include those which come to have markings because of marking errors even if they have been found good by the probing test.

9. The method according to claim 6, whereby the image of each of devices in the matrix pattern picked up in the course of the imaging step is divided into fine picture elements and the marking on a device is determined to be a pseudo-marking on the basis of those picture elements of the device on which the marking is present according to the comparing and determining steps.

* * * * *

UNITED STATES PATENT AND TRADEMARK OFFICE
CERTIFICATE OF CORRECTION

PATENT NO. : 4,965,515
DATED : OCTOBER 23, 1990
INVENTOR(S) : WATARU KARASAWA

It is certified that error appears in the above-identified patent and that said Letters Patent is hereby corrected as shown below:

ON TITLE PAGE:
   In the Foreign Application Priority Data, please delete --Oct. 15, 1986 [JP]   Japan ...............61-244948--.

Signed and Sealed this

Second Day of June, 1992

Attest:

DOUGLAS B. COMER

Attesting Officer

Acting Commissioner of Patents and Trademarks